(12) United States Patent
Suzuki et al.

(10) Patent No.: US 8,809,924 B2
(45) Date of Patent: Aug. 19, 2014

(54) IMAGING DEVICE, METHOD FOR FABRICATING IMAGING DEVICE, AND IMAGING APPARATUS

(75) Inventors: Hideyuki Suzuki, Kanagawa (JP); Kiyohiko Tsutsumi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 26 days.

(21) Appl. No.: 13/580,043

(22) PCT Filed: Feb. 24, 2011

(86) PCT No.: PCT/JP2011/054839
§ 371 (c)(1),
(2), (4) Date: Aug. 20, 2012

(87) PCT Pub. No.: WO2011/105625
PCT Pub. Date: Sep. 1, 2011

(65) Prior Publication Data
US 2012/0313142 A1   Dec. 13, 2012

(30) Foreign Application Priority Data

Feb. 25, 2010   (JP) .................................. 2010-041127
Sep. 13, 2010   (JP) .................................. 2010-204944

(51) Int. Cl.
*H01L 31/062*  (2012.01)
*H01L 27/146*  (2006.01)
*H01L 21/00*   (2006.01)
*H01L 27/00*   (2006.01)

(52) U.S. Cl.
USPC ............. 257/292; 257/40; 257/290; 257/291; 257/443; 257/444; 250/200; 250/208.1; 438/48; 438/57; 438/73; 438/82; 438/99

(58) Field of Classification Search
USPC ................... 257/40, 290–292, 440, 443, 444, 257/E51.026, E51.041, E27.133, E27.135; 250/200, 208.1; 438/48, 57, 73, 82, 99
See application file for complete search history.

(56) References Cited

U.S. PATENT DOCUMENTS

| | | |
|---|---|---|
| 2006/0071253 A1 | 4/2006 | Nii |
| 2007/0063156 A1 | 3/2007 | Hayashi |

(Continued)

FOREIGN PATENT DOCUMENTS

| | | |
|---|---|---|
| JP | 2006100508 A | 4/2006 |
| JP | 200788033 A | 4/2007 |

(Continued)

OTHER PUBLICATIONS

Japanese Office Action dated Mar. 29, 2011 issued by the Japanese Patent Office in counterpart Japanese Patent Application No. 2010-204944.

(Continued)

*Primary Examiner* — Julio J Maldonado
*Assistant Examiner* — Cory Eskridge
(74) *Attorney, Agent, or Firm* — Sughrue Mion, PLLC

(57) ABSTRACT

According to an aspect of the invention, an imaging device includes a plurality of photoelectric conversion elements and a read-out portion. The photoelectric conversion elements are arranged above a substrate. The read-out portion reads out signal corresponding to charges which are generated from each of the photoelectric conversion elements. Each of the photoelectric conversion elements includes a first electrode that collects the charge, a second electrode that is disposed opposite to the first electrode, a photoelectric conversion layer that generates the charges and disposed between the first electrode and the second electrode, and an electron blocking layer that is disposed between the first electrode and the photoelectric conversion layer. Distance between the first electrodes of adjacent photoelectric conversion elements is 250 nm or smaller. Each of the electron blocking layers has a change in surface potential of −1 to 3 eV from a first face to a second face.

17 Claims, 3 Drawing Sheets

(56) References Cited

U.S. PATENT DOCUMENTS

| | | |
|---|---|---|
| 2008/0035965 A1 | 2/2008 | Hayashi et al. |
| 2009/0050881 A1* | 2/2009 | Hayashi .......................... 257/40 |
| 2009/0152439 A1* | 6/2009 | Goto ............................ 250/200 |
| 2009/0189058 A1 | 7/2009 | Mitsui et al. |
| 2010/0089452 A1 | 4/2010 | Suzuki et al. |
| 2010/0102303 A1 | 4/2010 | Nomura et al. |
| 2012/0025179 A1 | 2/2012 | Mitsui et al. |

FOREIGN PATENT DOCUMENTS

| | | |
|---|---|---|
| JP | 200872090 A | 3/2008 |
| JP | 2008218445 A | 9/2008 |
| JP | 2009147147 A | 7/2009 |
| JP | 2009200482 A | 9/2009 |
| JP | 2010100575 A | 5/2010 |
| JP | 2010183060 A | 8/2010 |

OTHER PUBLICATIONS

International Search Report dated Apr. 5, 2011 issued in International Application No. PCT/JP2011/054839 (PCT/ISA/210).

Written Opinion dated Apr. 5, 2011 issued in International Application No. PCT/JP2011/054839 (PCT/ISA/237).

* cited by examiner

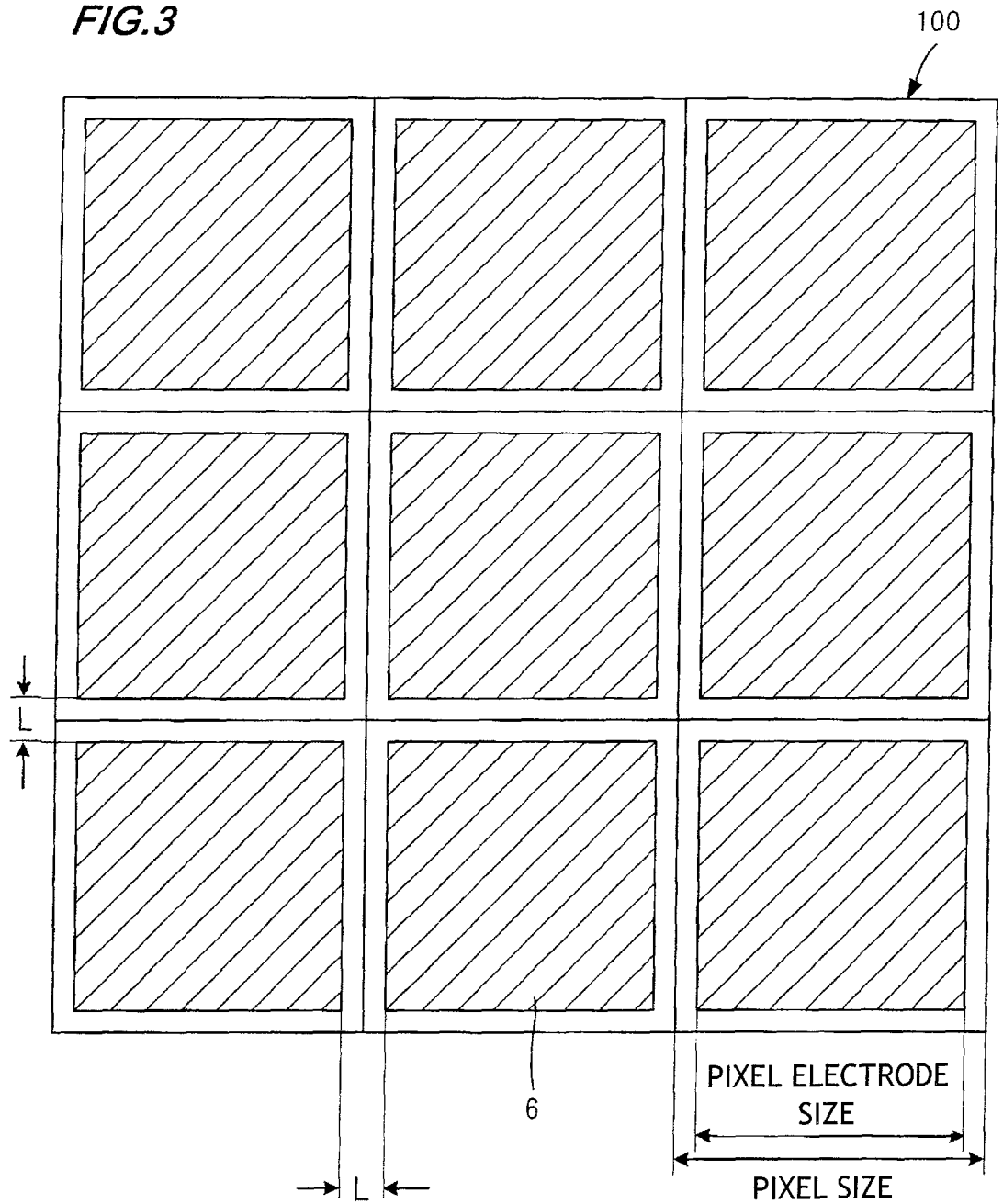

IMAGING DEVICE, METHOD FOR FABRICATING IMAGING DEVICE, AND IMAGING APPARATUS

TECHNICAL FIELD

This invention relates to an imaging device, a method of fabricating the imaging device, and an imaging apparatus having the imaging device.

BACKGROUND ART

Research and development has been directed toward organic photoelectric conversion elements using an organic compound. An organic photoelectric conversion element includes a stack of a plurality of functional layers, including a photoelectric conversion layer that absorbs light to generate charges, a pair of electrodes having the photoelectric conversion layer therebetween, and a charge blocking layer that prevents charge injection from the electrode(s) into the photoelectric conversion layer as described, e.g., in JP-2007-88033A. JP-2009-147147A discloses a stacked typed imaging device having a plurality of such organic photoelectric conversion elements, in which a photoelectric conversion layer is shared by all pixels while each pixel has a dedicated pixel electrode.

SUMMARY OF INVENTION

Technical Problem

In order to increase the number of pixels of a stacked typed imaging device while reducing the size of the device as a whole, it is necessary to minimize the area per pixel inclusive of the pixel electrode and the space between adjacent pixel electrodes. Reducing the area per pixel may be achieved by reducing the size of the pixel electrode or the distance between adjacent pixel electrodes. Considering that reduction in pixel electrode size may lead to reduction in sensitivity, reduction in distance between adjacent pixel electrodes is considered effective.

The problem is that because a stacked typed imaging device has an array of pixels in which the pixels are arranged very closely to each other, reduction in distance between adjacent pixel electrodes can increase the probability of pixel crosstalk, a phenomenon by which an electrical charge photogenerated in the photoelectric conversion layer of one pixel leaks into the photoelectric conversion layer of an adjacent pixel to cause pixel crosstalk. To put it another way, a stacked typed imaging device has difficulty in reducing the pixel size because of necessity to secure certain spacing between adjacent pixel electrodes for preventing pixel crosstalk as well as a certain pixel electrode size for improving sensitivity.

An object of the invention is to provide an imaging device having a configuration that achieves high sensitivity, prevents pixel crosstalk, and allows for increasing the number of pixels and device miniaturization; a method for making the imaging device; and an imaging apparatus having the imaging device.

Solution to Problem

[1] According to an aspect of the invention, an imaging device includes:
  a plurality of photoelectric conversion elements that is arranged above a substrate; and
  a read-out portion that reads out signal corresponding to charges which are generated from each of the photoelectric conversion elements,
  wherein each of the photoelectric conversion elements comprises:
    a first electrode that collects the charge;
    a second electrode that is disposed opposite to the first electrode;
    a photoelectric conversion layer that generates the charges in response to light incident on the photoelectric conversion layer and disposed between the first electrode and the second electrode; and
    an electron blocking layer that is disposed between the first electrode and the photoelectric conversion layer,
  wherein a distance between the first electrodes of adjacent photoelectric conversion elements is 250 nm or smaller, and
    each of the electron blocking layers has a first face nearer to the first electrode and a second face nearer to the second electrode and has a change in surface potential of −1 to 3 eV from the first face to the second face.

[2] The imaging device according to the paragraph 1, wherein each of the electron blocking layer has a change in surface potential of −0.5 eV or more from the first face to the second face.

[3] The imaging device according to paragraph 1 or 2, wherein each of the electron blocking layer has a change in surface potential of 1 eV or less from the first face to the second face.

[4] The imaging device according to any one of paragraphs 1 to 3, wherein the photoelectric conversion layer has a bulk heterojunction structure formed of a mixture of a p type organic semiconductor and a fullerene or a fullerene derivative.

[5] According to another aspect of the invention, a method for fabricating an imaging device including a substrate, an array of photoelectric conversion elements above the substrate, and read-out portions one each for each photoelectric conversion element, the photoelectric conversion elements each comprising a photoelectric conversion layer generating charge in response to light incident thereon, a first electrode collecting the charge, a second electrode opposite to the first electrode, and at least one electron blocking layer, the photoelectric conversion layer being between the first electrode and the second electrode, the at least one electron blocking layer being between the first electrode and the photoelectric conversion layer and having a first face nearer to the first electrode and a second face nearer to the second electrode, and the read-out portions being to read a signal corresponding to the charge generated by the respective photoelectric conversion elements,
  the method includes forming the array of photoelectric conversion elements above the substrate,
  wherein the forming step includes:
    deciding the thickness and the material of the at least one electron blocking layer so that each of the at least one electron blocking layer has a change in surface potential of −1 to 3 eV from the first face to the second face; and
    forming the first electrode for every one of the photoelectric conversion elements so that the distance between the first electrodes of adjacent photoelectric conversion elements is 250 nm or smaller.

[6] The method according to paragraph 5, wherein the thickness and the material of each of the at least one electron blocking layer are decided so that each of the at least one electron blocking layer has a change in surface potential of −5 eV or more from the first face to the second face.

[7] The method according to paragraph 5 or 6, wherein the thickness and the material of each of the at least one electron blocking layer are decided so that each of the at least one electron blocking layer has a change in surface potential of 1 eV or less from the first face to the second face.

[8] The method according to any one of paragraphs 5 to 7, wherein the forming step further includes forming the photoelectric conversion layer by co-depositing a p type organic semiconductor and a fullerene or a fullerene derivative.

[9] According to another aspect of the invention, an imaging apparatus includes the imaging device according to any one of paragraphs 1 to 4.

Advantageous Effects of Invention

The present invention provides an imaging device having a configuration that achieves high sensitivity, prevents pixel crosstalk, and allows for increasing the number of pixels and device miniaturization; a method for making the imaging device; and an imaging apparatus having the imaging device.

BRIEF DESCRIPTION OF DRAWINGS

FIG. 3 illustrates a pixel size, a pixel electrode size, and a distance between adjacent pixel electrodes.

DESCRIPTION OF EMBODIMENTS

The imaging device of the invention will be illustrated on the basis of its exemplary embodiment with reference to the accompanying drawings. The imaging device of this embodiment is used to be mounted on an imaging apparatus, such as a digital still camera or a digital video camera, or an imaging module of a mobile phone, an endoscope, and the like.

Figure 1:
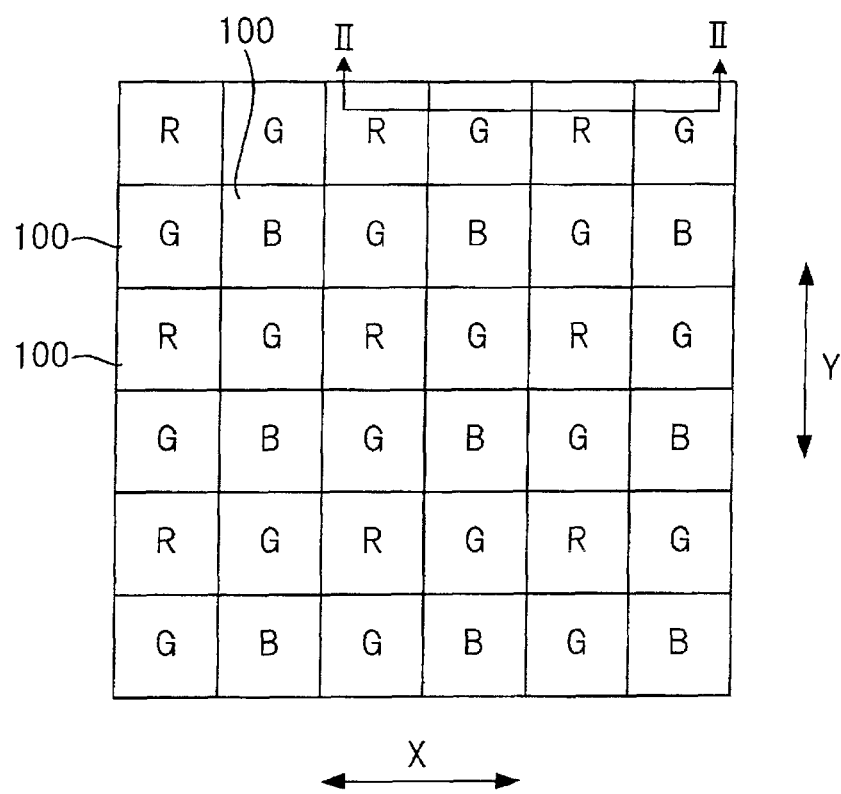
FIG. 1 is a schematic surface view of an imaging device illustrative of an exemplary embodiment of the invention.

FIG. 1 is a schematic surface view illustrative of an imaging device according to an exemplary embodiment of the invention, in which 36 pixels are arranged in 6 rows and 6 columns.

The imaging device of FIG. 1 has pixels 100 arranged two dimensionally on the same plane in both a row direction X and a column direction Y perpendicular to the row direction X (in a square grid in FIG. 1).

The pixels 100 include R pixels detecting red (R) light (indicated by "R" in FIG. 1), G pixels detecting green (G) light (indicated by "G" in FIG. 1), and B pixels detecting blue (B) light (indicated by "B" in FIG. 1).

In FIG. 1, R pixels and G pixels alternate in the row direction X to make RG rows. G pixels and B pixels alternate in the row direction X to make GB rows. The RG rows and the GB rows alternate in the column direction Y.

Figure 2:
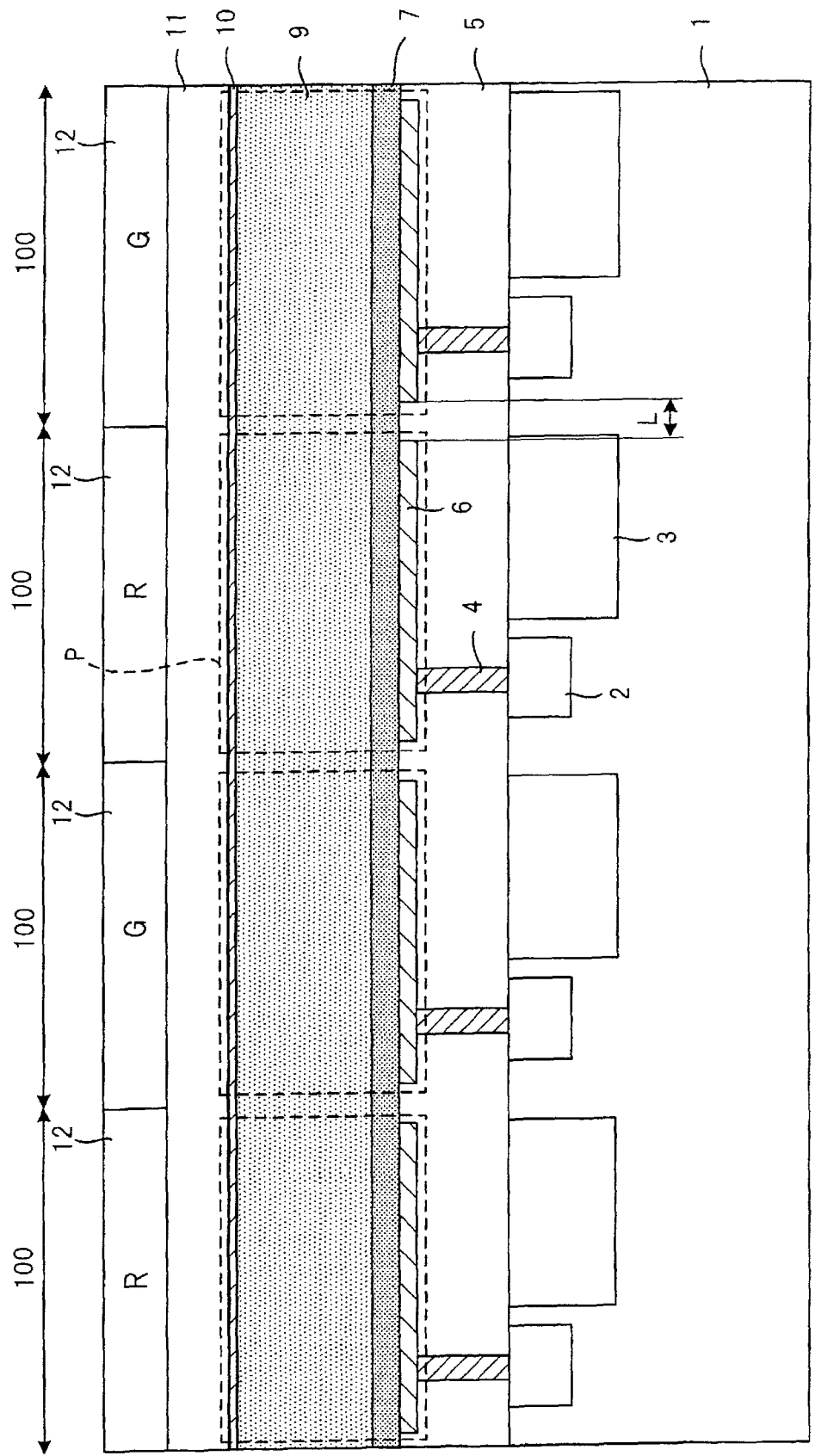
FIG. 2 is a schematic cross-section of the imaging device of FIG. 1, taken along line II-II.

FIG. 2 is a schematic cross-section of the imaging device of FIG. 1, taken along line II-II. As illustrated, each pixel 100 includes a charge storage portion 2, a read-out portion 3, a vertical interconnect 4, a photoelectric conversion element P, a sealing layer 11, and a color filter 12.

The photoelectric conversion element P receives light to generate charge in response to the light received. The photoelectric conversion element P has a pixel electrode 6, an electron blocking layer 7, a photoelectric conversion layer 9, and a counter electrode 10 stacked in the order named on a silicon substrate 1.

Each pixel 100 has a dedicated pixel electrode 6. The electron blocking layer 7, the photoelectric conversion layer 9, and the counter electrode 10 are each shared by all the pixels 100.

The charge storage portion 2 stores the holes generated in the photoelectric conversion element P.

The read out portion 3 converts the holes stored in the charge storage portion 2 to a corresponding signal and outputs the signal. The read out portion 3 has, for example, a circuit composed of a charge coupled device and an amplifier or a metal oxide semiconductor (MOS) circuit using an MOS transistor.

The vertical interconnect 4 provides an electrical connection between the pixel electrode 6 and the charge storage portion 2 and is formed of a conductive material, such as metal, on the charge storage portion 6.

The pixel electrode 6 collects the holes photogenerated in the photoelectric conversion layer 9. The pixel electrode 6 and the interconnect 4 are formed in an insulating layer 5, e.g., of silicon oxide which is provided on the silicon substrate 1.

The pixel electrode 6 is made of, for example, metals, metal oxides, metal nitrides, metal borides, organic conductive compounds, and mixtures thereof. Specific examples thereof include conductive metal oxides, such as tin oxide, zinc oxide, indium oxide, indium tin oxide (ITO), indium zinc oxide (IZO), indium tungsten oxide (IWO), and titanium oxide; metal nitrides, such as titanium nitride; metals, such as gold, platinum, silver, chromium, nickel, and aluminum; mixtures or laminates of the metal and the conductive metal oxide recited above; organic conductive substances, such as polyaniline, polythiophene, and polypyrrole; and laminates of ITO with the material recited above. Preferred of them are titanium nitride, molybdenum nitride, tantalum nitride, and tungsten nitride.

The electron blocking layer 7 blocks electrons from the pixel electrode 6 from being injected into the photoelectric conversion layer 9. The electron blocking layer 7 is preferably made of a material providing a high barrier against the electron injection from the adjacent electrode and exhibiting high hole transport properties. Two or more electron blocking layers 7 may be provided between the pixel electrode 6 and the photoelectric conversion layer 9.

The photoelectric conversion layer 9 contains an organic photoelectric material that receives light to generate charge (electron and hole) in response to the amount of light received. Since the imaging device of the present embodiment carries out color separation using color filters 12, the photoelectric conversion layer 9 must be made of a material sensitive to the entire visible spectrum.

The counter electrode 10, which must transmit visible light to the photoelectric conversion layer 9, is made of a material transparent to visible light, such as ITO. A bias voltage is to be applied to the counter electrode 10 through unshown wiring. The imaging device of the present embodiment is configured to collect holes in the pixel electrodes 6, the polarity of the bias voltage to be applied is decided so that holes may be swept to the pixel electrodes 6 while electrons are swept to the counter electrode 10.

Examples of the materials making the counter electrode 10 include metals, metal oxides, metal nitrides, metal borides, organic conductive compounds, and mixtures thereof. Specific examples thereof include conductive metal oxides, such as tin oxide, zinc oxide, indium oxide, indium tin oxide (ITO), indium zinc oxide (IZO), indium tungsten oxide (IWO), and titanium oxide; metal nitrides, such as titanium nitride; metals, such as gold, platinum, silver, chromium, nickel, and aluminum; mixtures or laminates of the metal and the conductive metal oxide recited above; organic conductive substances, such as polyaniline, polythiophene, and polypyrrole; and laminates of ITO with the material recited above.

The color filters 12 are formed above the counter electrode 10 with the sealing layer 11 therebetween. The color filter 12 of the R pixel 100, which is indicated by "R" in FIG. 2, transmits R light. The color filter 12 of the G pixel 100, which is indicated by "G" in FIG. 2, transmits G light. The color filter 12 of the B pixel 100, which is indicated by "B" in FIG. 2, transmits B light.

The inventors have studied on a method for avoiding pixel crosstalk induced by a small space or distance between adjacent pixel electrodes 6 in an imaging device having the described configuration. As a result of comparing experimentally prepared imaging devices the electron blocking layer(s) 7 of which is/are made of different materials and has/have a varied thickness, the inventors have found that pixel crosstalk is prevented from occurring even with a small distance (more specifically, 250 nm or smaller) between adjacent pixel electrodes 6 by properly selecting the material and the thickness of the electron blocking layer(s) 7 so that the change in surface potential from the surface of every electron blocking layer nearer to the pixel electrode 6 (hereinafter referred to as "a first surface") to the opposite surface of the electron blocking layer nearer to the counter electrode 10 (hereinafter referred to as "a second surface") may be −1 or more (preferably −0.5 eV or more) and 3 eV or less (preferably 1 eV or less). The change in surface potential from the first surface to the second surface of every electron blocking layer will sometimes simply referred to as "the change in surface potential" or "the surface potential change".

Examples of materials that are preferably used to make the electron blocking layer 7 include a compound represented by formula (1-A1) shown below and a compound represented formula (1-A2) shown below. The thickness of the electron blocking layer is decided as appropriate so as to provide the above recited change in surface potential depending on the material. For example, an electron blocking layer made of the compound of formula (1-A1) preferably has a thickness of 3 to 200 nm, and that made of the compound of formula (1-A2) preferably has a thickness of 20 to 100 nm.

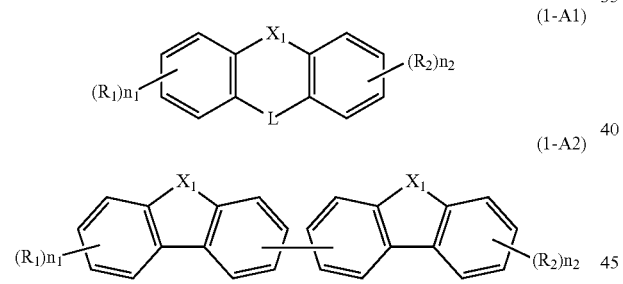

(1-A1)

(1-A2)

In formulae (1-A1) and (1-A2), each of $R_1$ and $R_2$ independently represents a heterocyclic group optionally substituted with one or more alkyl groups; each of $X_1$ and $X_2$ independently represents a carbon atom, a nitrogen atom, an oxygen atom, a sulfur atom, or a silicon atom, each of which may have a substituent if possible; L represents a single bond, an oxygen atom, a sulfur atom, an alkylene group, an alkenylene group, a cycloalkylene group, a cycloalkenylene group, an arylene group, a divalent heterocyclic group, or an imino group, each of which may have a substituent if possible; and each of n1 and n2 independently represents an integer 1 to 4.

The heterocyclic group as represented by $R_1$ or $R_2$ may be a condensed ring structure composed of two to five monocyclic groups. The heterocyclic group preferably contains 6 to 30, more preferably 6 to 20, carbon atoms. The alkyl group, which may be on the heterocyclic group, is preferably a C1-C6 straight-chain, branched, or cyclic alkyl group. When the heterocyclic group has a plurality of alkyl groups, they may be taken together to form a ring, e.g., a benzene ring. The alkyl group is preferably a branched alkyl group. Examples of the alkyl group are methyl, ethyl, isopropyl, t-butyl, and neopentyl, with t-butyl being preferred.

L represents a single bond, an oxygen atom, a sulfur atom, an alkylene group, an alkenylene group, a cycloalkylene group, a cycloalkenylene group, an arylene group, a divalent heterocyclic group, or an imino group. L preferably represents a single bond, a C1-C12 alkylene group, a C2-12 alkenylene group (e.g., —CH2=CH2-), a C6-C14 arylene group (e.g., 1,2-phenylene or 2,3-naphthylene), a C4-C13 heterocyclic group, an oxygen atom, a sulfur atom, or an imino group having a C1-C12 hydrocarbon group (e.g., aryl or alkyl) (e.g., phenylimino, methylamino, or t-butylimino). L is more preferably a single bond, a C1-C6 alkylene group (e.g., methylene, 1,2-ethylene, or 1,1-dimethylmethylene), an oxygen atom, a sulfur atom, or a C1-C6 imino group. L is even more preferably a single bond or a C1-C6 alkylene group. The alkylene, alkenylene, cycloalkylene, cycloalkenylene, arylene, divalent heterocyclic ring, or imino group as L may be substituted with, for example, alkyl, halogen, aryl, or hetero ring.

Examples of the heterocyclic group optionally substituted with alkyl as represented by R1 and R2 are shown below, of which N2, N4, N13, N14, and N15 are preferred.

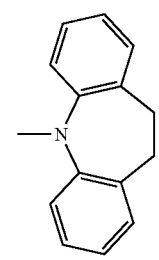

N1

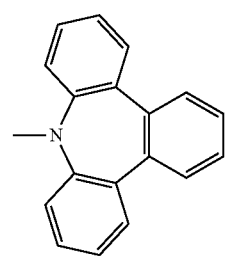

N2

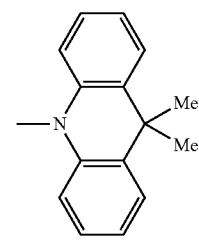

N3

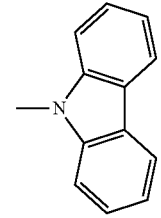

N4

N5 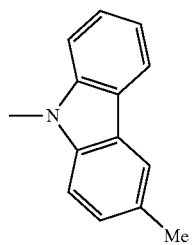

N6 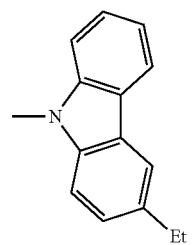

N7 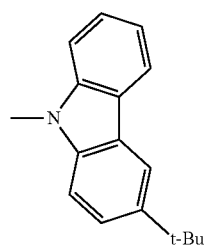

N8 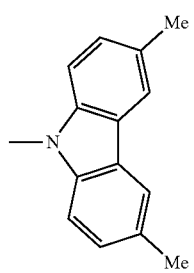

N9 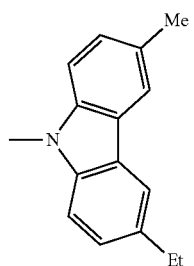

N10 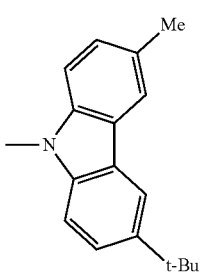

N11 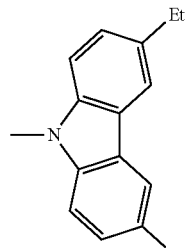

N12 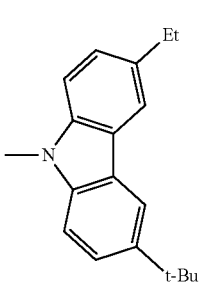

N13 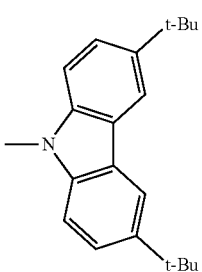

N14 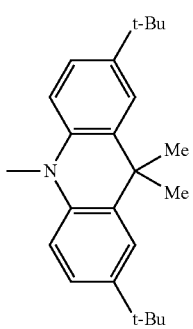

N15 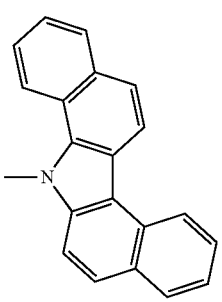

The substituent that may be possessed by X1 or X2 is preferably alkyl or aryl. The alkyl is preferably C1-C4 alkyl, such as methyl, ethyl, n-propyl, isopropyl, or t-butyl, with methyl being more preferred. The aryl is preferably C6-C20 aryl optionally substituted with alkyl, preferably C6-C15 aryl optionally substituted with C1-C4 alkyl, such as phenyl, naphthyl, anthracenyl, 9-dimethylfluorenyl, methylphenyl, or dimethylphenyl. Phenyl, naphthyl, anthracenyl, or 9-dimethylfluorenyl are particularly preferred.
Examples of the materials that are particularly preferred to make the electron blocking layer are shown below.
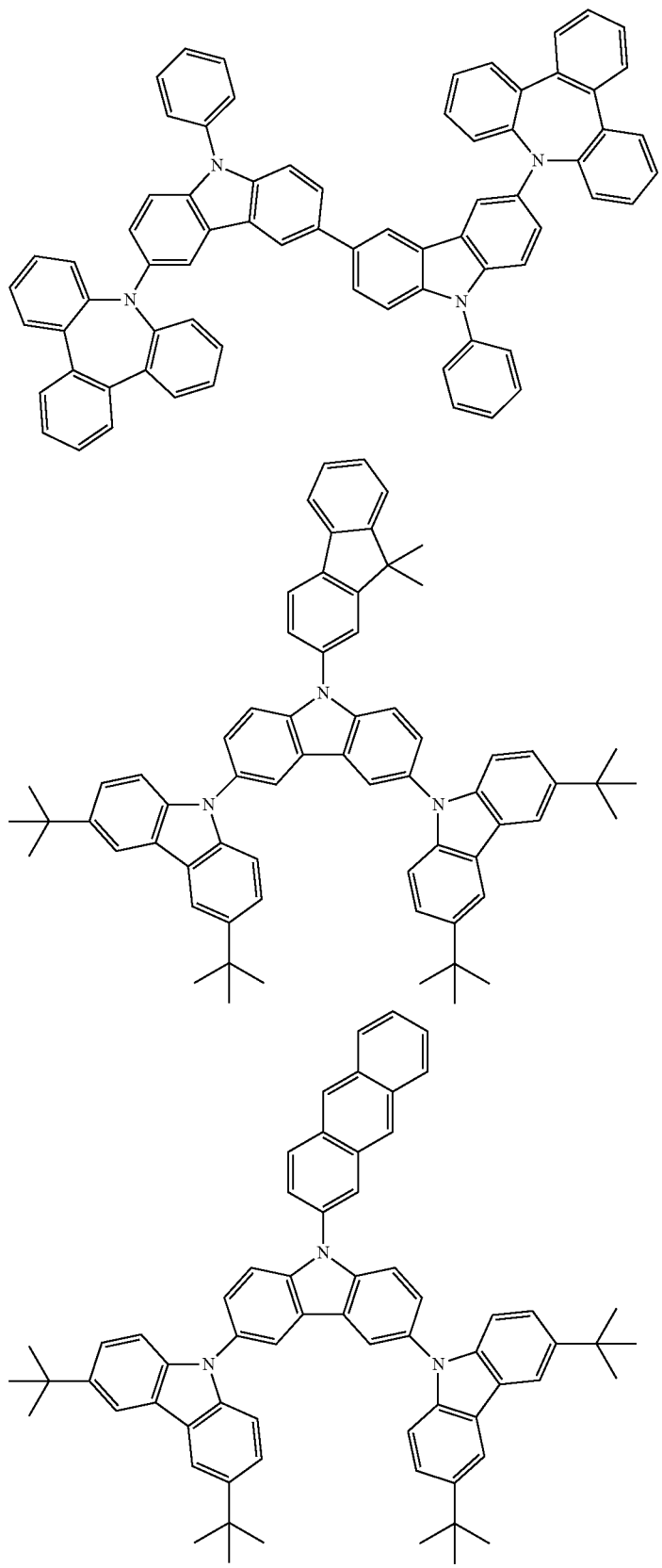

-continued
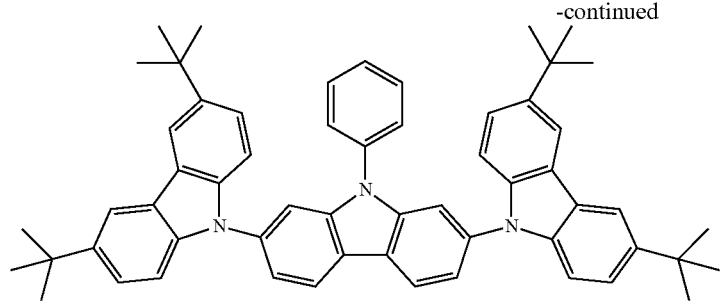
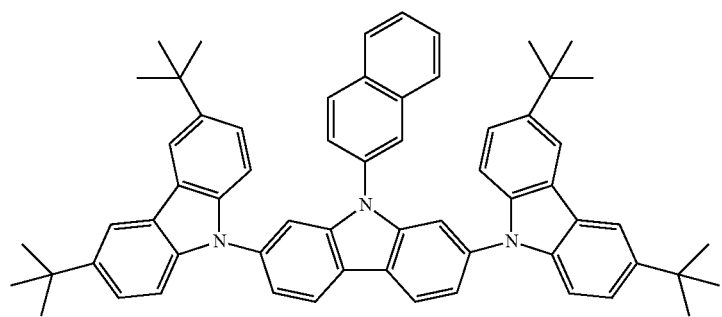
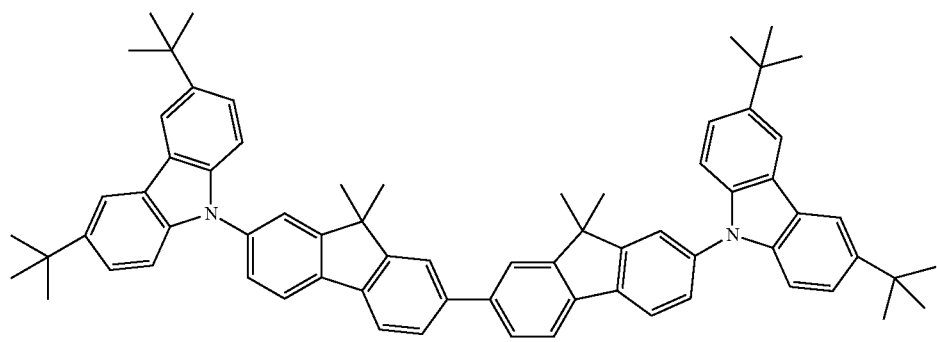
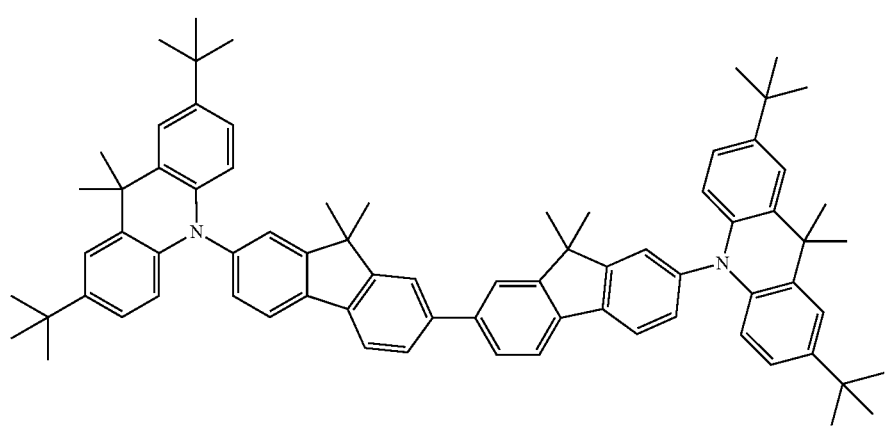

-continued

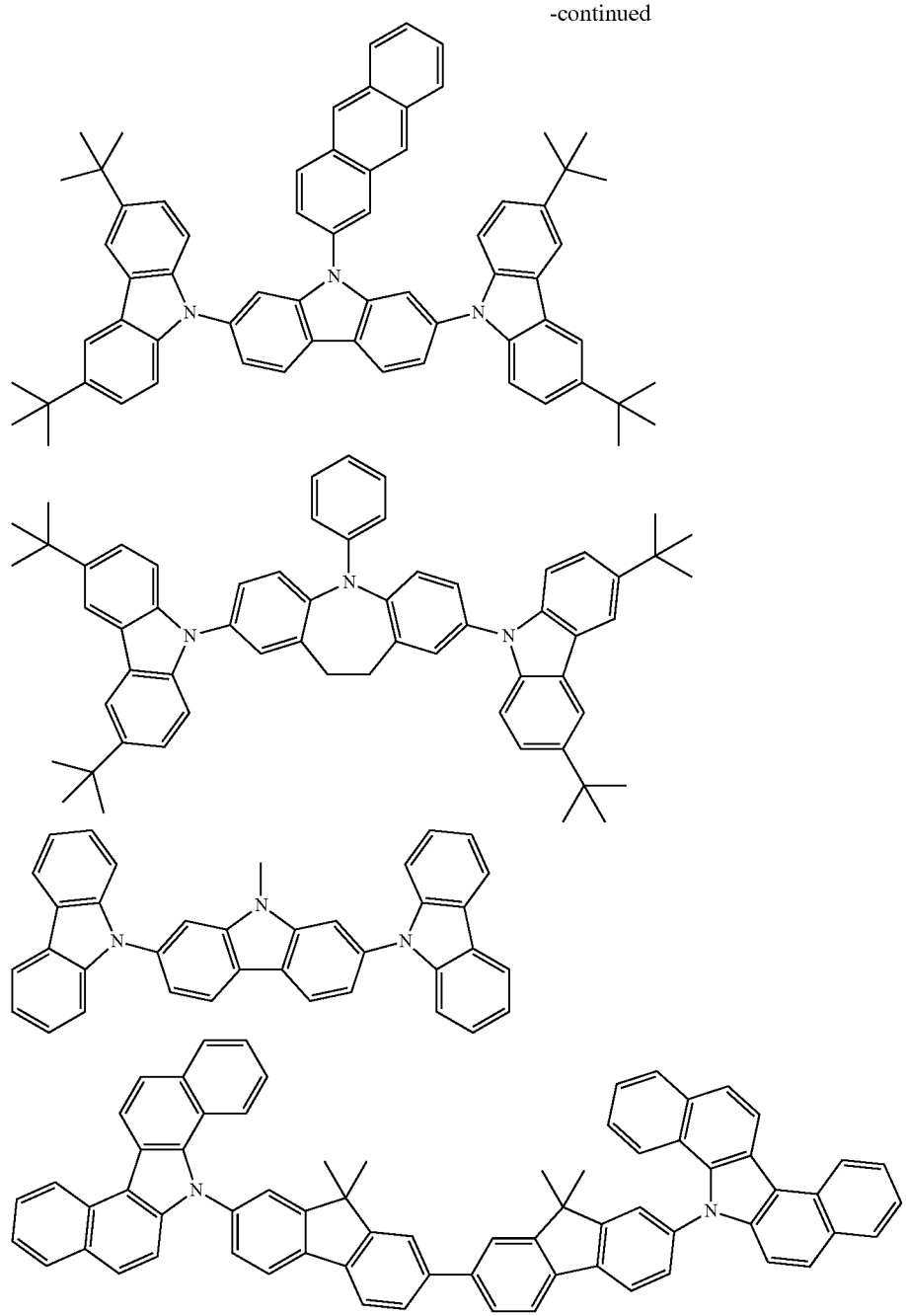

The photoelectric conversion layer 9 preferably has a bulk heterojunction structure formed of a mixture of a p type organic semiconductor and an n type organic semiconductor.

The p type semiconductor (compound) is a donating organic semiconductor (compound), i.e., an organic compound having electron donating character, which is mostly exemplified by a hole transporting organic compound. In some detail, when two organic materials are used in contact with each other, the material having a smaller ionization potential is called an electron donating compound. Any electron donating organic compound may be used, including triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (e.g., naphthalene derivatives, anthracene derivatives, phenanthrene derivatives, tetracene derivatives, pyrene derivatives, perylene derivatives, and fluoranthene derivatives), and metal complexes having a nitrogen-containing heterocyclic compound as a ligand. In addition, any organic compounds having a smaller ionization potential than an organic compound used as an n type organic semiconductor may be used as a donating organic semiconductor.

Any organic dyes may be used as an organic p type semiconductor or an organic n type semiconductor. Examples of preferred organic dyes include, but are not limited to, cyanine dyes, styryl dyes, hemicyanine dyes, merocyanine dyes (including zeromethine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, chroconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, and condensed aromatic carbocyclic compound dyes (e.g., naphthalene derivatives, anthracene derivatives, phenanthrene derivatives, tetracene derivatives, pyrene derivatives, perylene derivatives, and fluoranthene derivatives).

Preferred organic n type semiconductors are fullerenes and their derivatives. Examples of fullerenes include fullerene $C_{60}$, $C_{70}$, $C_{76}$, $C_{78}$, $C_{80}$, $C_{82}$, $C_{84}$, $C_{90}$, $C_{96}$, $C_{240}$, and $C_{540}$, mixed fullerenes, and fullerene nanotube. Fullerene derivatives are compounds derived from these fullerenes by addition of a substituent.

In what follows, the term "group" as used to indicate a specific group of atoms implies not only an unsubstituted group but a group substituted with up to the maximum possible number of substituents which may be identical or different. For instance, the term "alkyl group" is intended to mean a substituted or unsubstituted alkyl group. The compounds according to the invention may have any substituent.

The substituent will be inclusively referred to as a substituent W. Examples of the substituent W include, but are not limited to, a halogen atom, an alkyl (including cyclo-, bicyclo-, and tricycloalkyl) group, an alkenyl (including cyclo- and bicycloalkenyl) group, an alkynyl group, an aryl group, a heterocyclic (hetero ring) group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino (including anilino) group, an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group ($-B(OH)_2$), a phosphate group ($-OPO(OH)_2$), a sulfato group ($-OSO_3H$), and other known substituents.

The fullerene derivative is preferably represented by formula below.

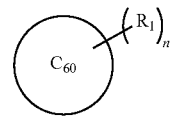

wherein $R_1$ represents a substituent, such as the substituent W; and n represents an integer 1 to 60.

The substituent as $R_1$ is preferably an alkyl group, an aryl group, or a heterocyclic group. The preference on the substituent $R_1$ and examples of the preferred substituent $R_1$ are identical to those described with respect to the substituent W. The alkyl group as $R_1$ is more preferably a C1 to C12 alkyl group. Examples of preferred aryl and heterocyclic groups are benzene, naphthalene, anthracene, phenanthrene, fluorene, triphenylene, naphthacene, biphenyl, pyrrole, furan, thiophene, imidazole, oxazole, thiazole, pyridine, pyrazine, pyrimidine, pyridazine, indolizine, indole, benzofuran, benzothiophene, isobenzofuran, benzimidazole, imidazopyridine, quinolidine, quinoline, phthalazine, naphthyridine, quinoxaline, quinoxazoline, isoquinoline, carbazole, phenanthridine, acridine, phenanthroline, thianthrene, chromene, xanthene, phenoxathiin, phenothiazine, and phenazine. Examples of more preferred aryl and heterocyclic groups are benzene, naphthalene, anthracene, phenanthrene, pyridine, imidazole, oxazole, and thiazole. Particularly preferred of these aryl and heterocyclic groups are benzene, naphthalene, and pyridine. The substituent $R_1$ may have one or more substituents which may be taken together to form a ring.

n is preferably 1 to 10. When n is 2 or greater, each $R_1$ may be the same as or different from each other $R_1$. The two or more $R_1$'s may be taken together to form a ring structure if possible.

Specific but non-limiting examples of the fullerene derivatives that are preferably used in the invention are shown below.

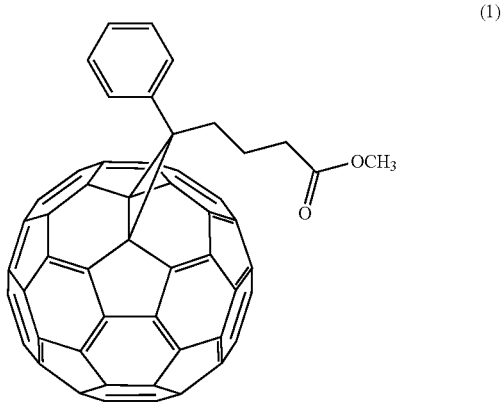

(1)

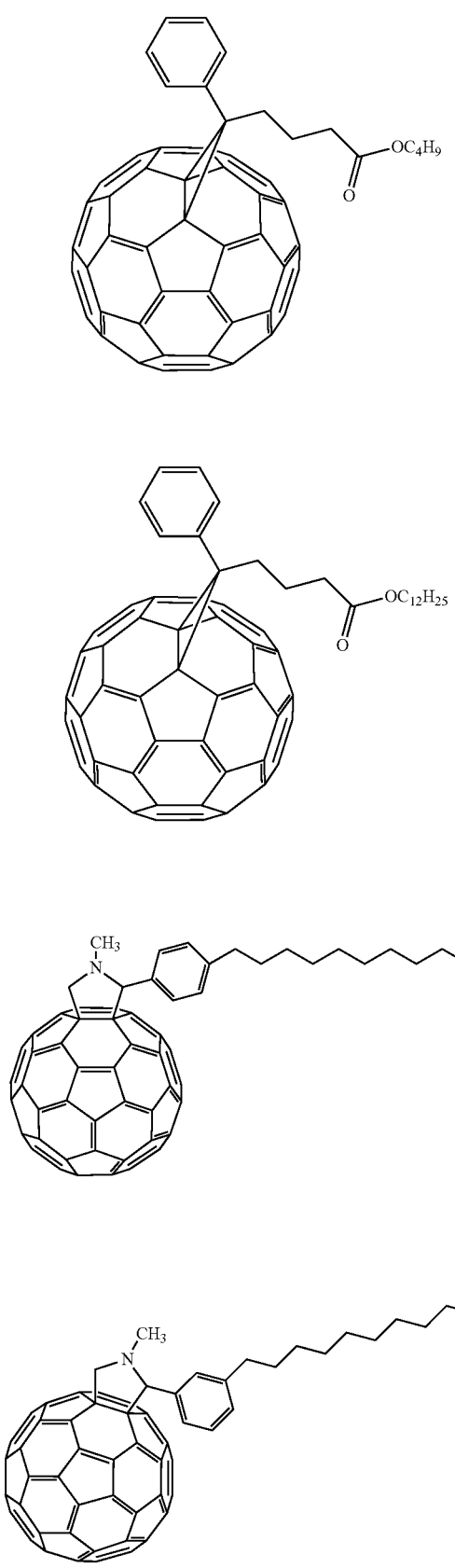

(9)

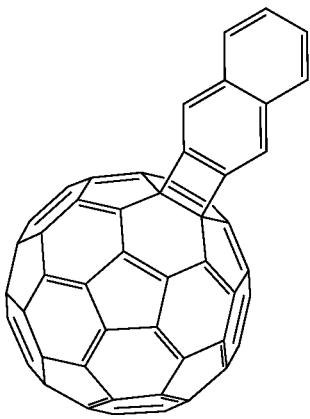

(10)

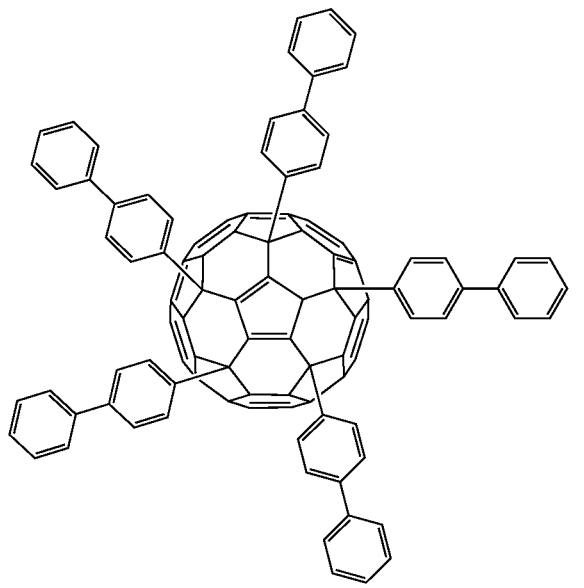

The fullerenes and fullerene derivatives described in The Chemical Society of Japan (ed.), *Quarterly Chemical Reviews* No. 43 (1999), JP 10-167994A, JP 11-255508A, JP 11-255509A, JP 2002-241323A, and JP 2003-196881A are also useful. The fullerenes and fullerene derivatives may be synthesized in accordance with known processes described, e.g., in The Chemical Society of Japan (ed.), *Quarterly Chemical Reviews* No. 43 (1999), JP 10-167994A, JP 11-255508A, JP 11-255509A, JP 2002-241323A, and JP 2003-196881A.

In the photoelectric conversion layer 9 containing a fullerene or a fullerene derivative, the photogenerated charges are rapidly transported through the molecules of the fullerene or the fullerene derivative to either the pixel electrode 6 or the counter electrode 10. When the molecules of the fullerene or the fullerene derivative are linked to form electron paths, the photoelectric conversion layer exhibits improved electron transport properties to provide a photoelectric conversion element having a fast response time. In this regard, it is desirable that a fullerene or a fullerene derivative be present in the photoelectric conversion layer 9 in an amount of 40% or more. It should be noted, however, that too high a content of a fullerene or a fullerene derivative means shortage of an organic p type semiconductor, which will result in reduction of junction interface and reduction of exciton dissociation efficiency.

It is preferred to use a triarylamine compound described in Japanese Patent 4213832 as an organic p type semiconductor to be mixed with a fullerene or a fullerene derivative. Using the triarylamine compound brings about an improved SN ratio. If the content of a fullerene or a fullerene derivative in the photoelectric conversion layer 9 is too high, the content of the triarylamine compound is relatively too low, resulting in reduction of light absorption and, consequently, reduction in photoelectric conversion efficiency. Therefore, the content of a fullerene or a fullerene derivative in the photoelectric conversion layer 9 is preferably not more than 85%.

The p type organic semiconductor that is preferably used to make the photoelectric conversion layer 9 is a compound represented by formula (2):

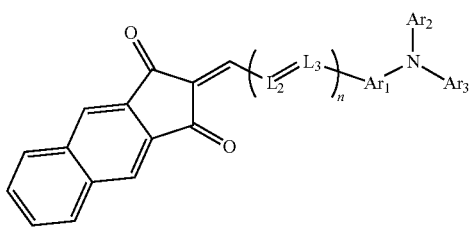

(2)

wherein each of $L_2$ and $L_3$ independently represents a methine group; n represents an integer of 0 to 2; $Ar_1$ represents a substituted or unsubstituted arylene group; and each of $Ar_2$ and $Ar_3$ independently represents a substituted or unsubstituted aryl group.

The arylene group as $Ar_1$ preferably contains 6 to 30, more preferably 6 to 18, carbon atoms. The arylene group may be substituted. The arylene group is preferably a C6-C18 arylene group optionally substituted with C1-C4 alkyl, such as phenylene, naphthylene, anthracenylene, methylphenylene, or dimethylphenylene. Phenylene or naphthylene is more preferred. Naphthylene is the most preferred.

The aryl group as $Ar_2$ and $Ar_3$ preferably contains 6 to 30, more preferably 6 to 18, carbon atoms. The aryl group may be substituted. The aryl group is preferably a C6-C18 aryl group optionally substituted with C1-C4 alkyl or C6-C18 aryl, such as phenyl, naphthyl, anthracenyl, methylphenyl, dimethylphenyl, or biphenyl. Phenyl or naphthyl is more preferred. Naphthyl is the most preferred.

n is preferably 0 or 1.

Examples of the compounds of formula (2) include, but are not limited to, the following compounds.

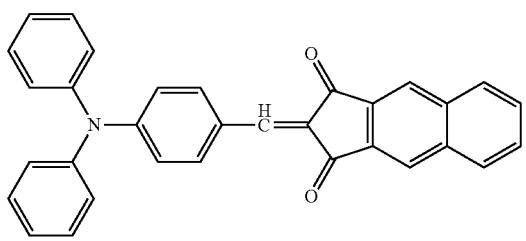

-continued

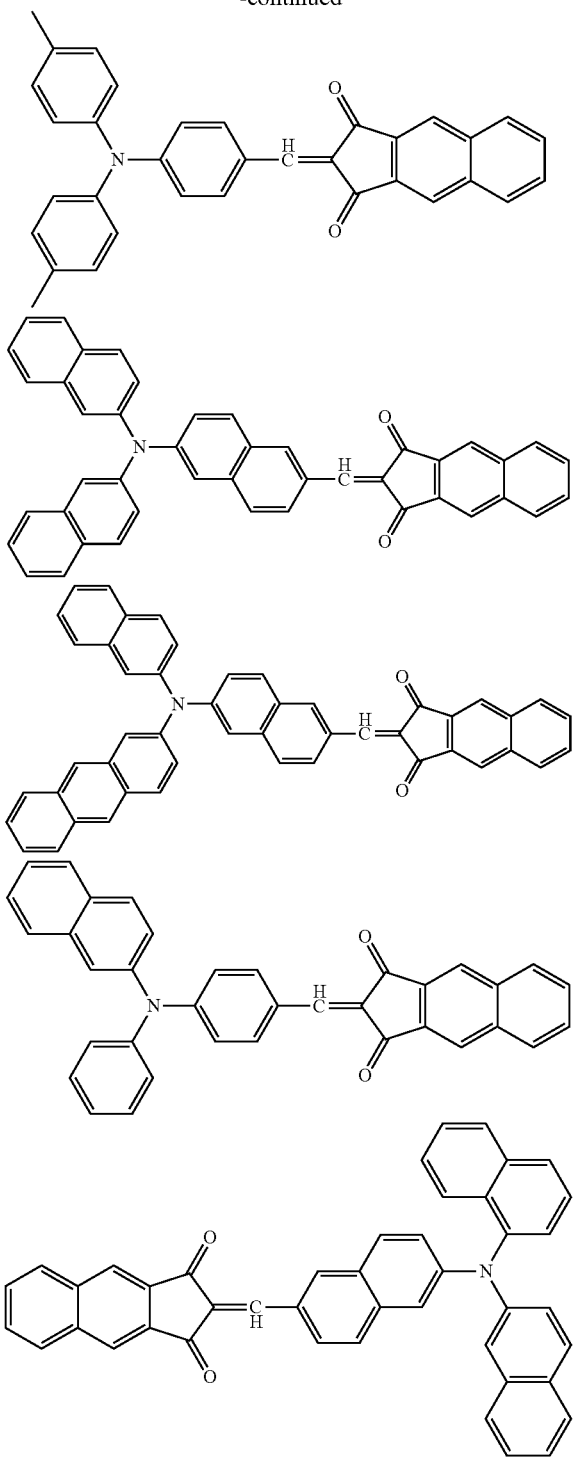

The above described imaging device may be fabricated as follows. A circuit substrate 1 having charge storage portions 2 and read out portions 3 is provided. An insulating layer 5 is formed on the substrate 1. Vertical interconnects 4 are formed through the insulating layer 5. An electrode material is deposited to cover the insulating layer 5 and the interconnects 4 and patterned to form pixel electrodes 6 spaced by a distance L (see FIGS. 2 and 3) of 250 nm or smaller. Assuming that each pixel electrode has a square shape, the pixel size is the length of a side of the pixel electrode plus the distance L. The pixel size thus defined is preferably 2.2 μm or smaller.

At least one electron blocking layer 7, a photoelectric conversion layer 9, and a counter electrode 10 are deposited successively on the pixel electrodes to make an array of photoelectric conversion elements P. In carrying out the step of making the array of photoelectric conversion elements P, the thickness and the material of every electron blocking layer 7 are selected so that the change in surface potential of the resulting electron blocking layer may be −1 eV or more, preferably −0.5 eV or more, and 3 eV or less, preferably from −0.5 eV to 1 eV. A sealing layer 11 and color filters 12 are then provided thereon to complete an imaging device.

According to the present invention, since the change in surface potential of the electron blocking layer 7 is controlled so as to range from −1 eV to 3 eV, pixel crosstalk is suppressed even when the distance between adjacent pixel electrodes is very small, as small as 250 nm, thereby to achieve high sensitivity. That fact that the distance between adjacent pixel electrodes is permitted to be reduced to 250 nm or even smaller allows for reducing the pixel size and thereby increasing the number of pixels.

While in the foregoing exemplary embodiment the imaging device performs color separation using color filters 12, the color filers 12 may be dispensed with; and, instead, the photoelectric conversion layer is made of a material sensitive to G light or infrared light.

The invention will now be illustrated in greater detail by way of Examples.

Example 1

An imaging device having organic photoelectric conversion elements was fabricated as follows. A CMOS substrate having CMOS read out circuits and connection electrodes was prepared. Titanium nitride was deposited on the CMOS substrate by sputtering, and the deposited TiN layer was patterned into 1.8-μm square pixel electrodes each located on each connection electrode. The distance between adjacent pixel electrodes was 200 nm. As a result, the pixel size (the length of a side of a square pixel) was 2 μm, with which size the demand for device miniaturization would be met.

Compound 1 shown below was deposited on the pixel electrodes by vacuum evaporation to a thickness of 100 nm to form an electron blocking layer (A). Compound 2 below and fullerene $C_{60}$ were co-deposited in a volume ratio of 1:2 on the electron blocking layer (A) by vacuum evaporation to a thickness of 400 nm to form a photoelectric conversion layer. All the vacuum evaporation operations for depositing the organic compounds were conducted at a degree of vacuum of $5.0 \times 10^{-4}$ Pa or less and a deposition rate of 0.1 to 1 nm/sec.

A counter electrode is formed of ITO by radio frequency magnetron sputtering to a thickness of 10 nm. Silicon monoxide was deposited thereon by vacuum evaporation to a thickness of 100 nm. Aluminum oxide was deposited on the silicon monoxide layer by atomic layer deposition to a thickness of 200 nm. Silicon nitride was deposited on the aluminum oxide layer by magnetron sputtering to a thickness of 100 nm. The silicon monoxide layer, aluminum oxide layer, and the silicon nitride layer made a sealing layer.

Examples 2 to 8 and Comparative Examples 1 to 5

Imaging devices were fabricated in the same manner as in Example 1, except for changing the material and thickness of the electron blocking layer (A) as shown in Tables 1 and 2 below.

Example 9

An imaging device having organic photoelectric conversion elements is fabricated as follows. A TiN layer was formed on the same CMOS substrate as used in Example 1 by sputtering and patterned into 1.8 µm square pixel electrodes each located on each connection electrode. The distance between adjacent pixel electrodes was 200 nm. As a result, the pixel size (the length of a side of a square pixel) was 2 µm, with which size the demand for device miniaturization will be met.

An electron blocking layer (A) was formed on the pixel electrodes by depositing compound 1 by vacuum evaporation to a thickness of 100 nm. Compound 3 shown below was deposited thereon by vacuum evaporation to form an electron blocking layer (B) with a thickness of 3 nm. Subsequently, a photoelectric conversion layer, a counter electrode, and a sealing layer were successively deposited in the same manner as in Example 1. All the vacuum evaporation operations for organic compound deposition were conducted at a degree of vacuum of $5.0 \times 10^{-4}$ Pa or less and a deposition rate of 0.1 to 1 nm/sec.

Examples 10 to 16 and Comparative Examples 6 to 8

Imaging devices were fabricated in the same manner as in Example 9, except for changing the materials and thicknesses of the electron blocking layers (A) and (B) as shown in Tables 1 and 2 below.

Compound 1

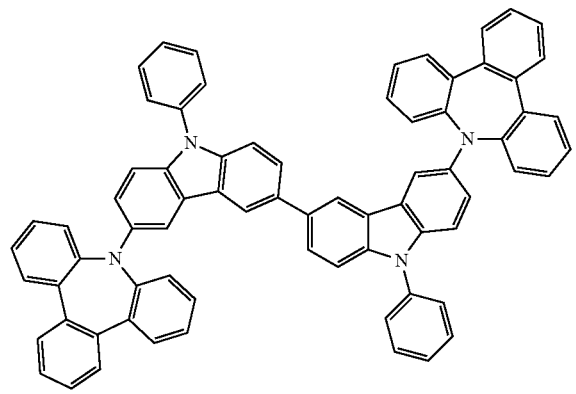

Compound 2

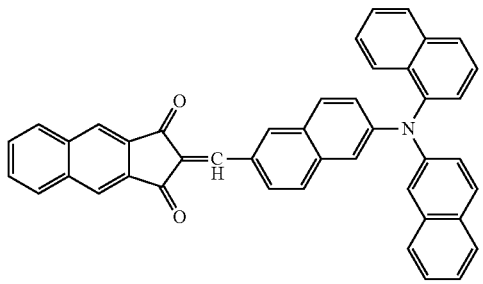

Compound 3

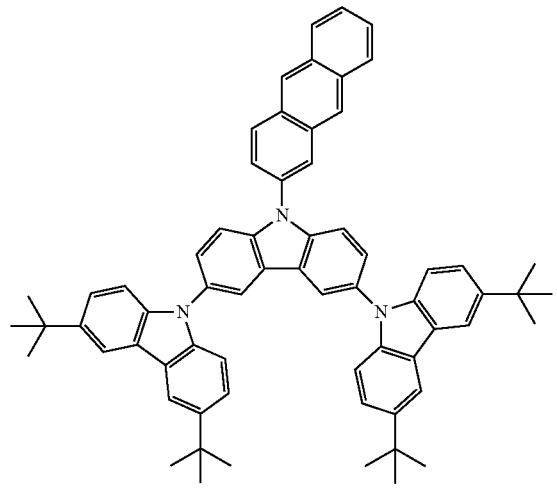

Compound 4

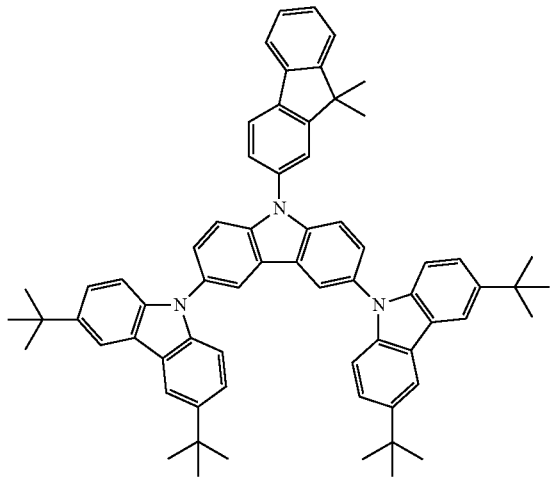

Compound 5

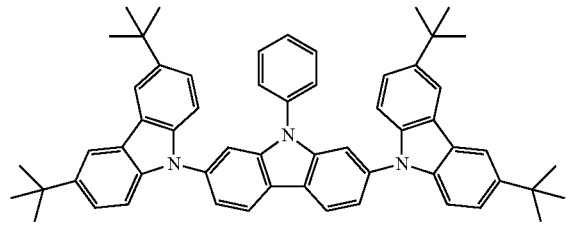

Compound 6

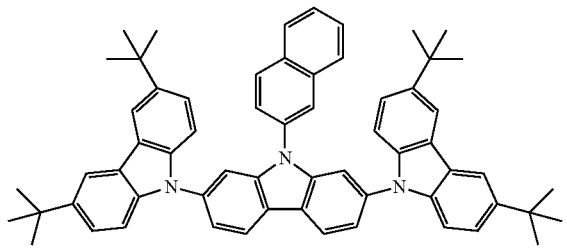

Compound 7
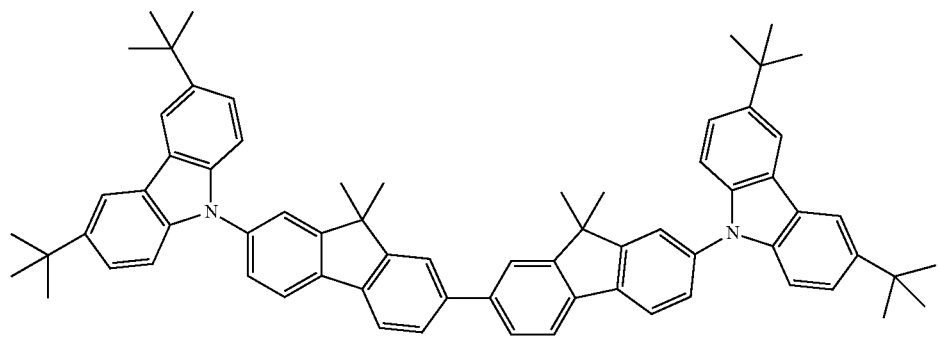
Compound 8
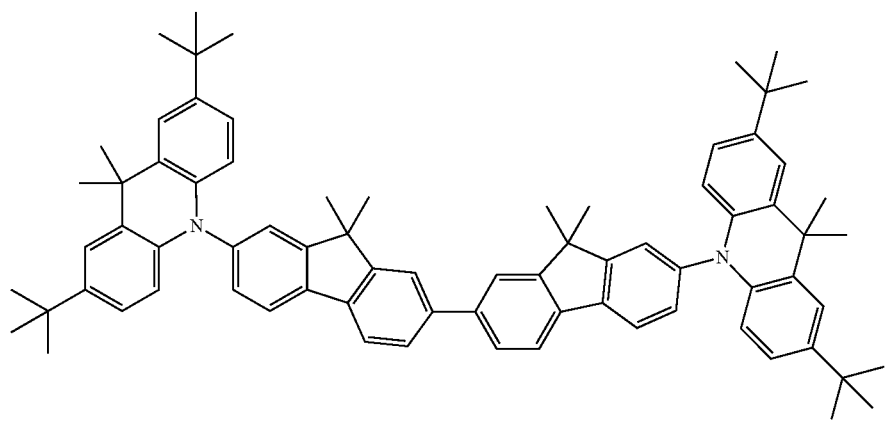
Compound 9
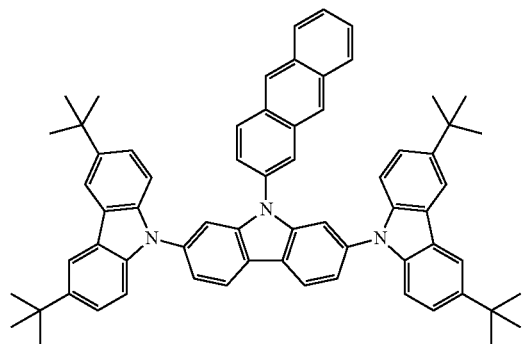
Compound 10
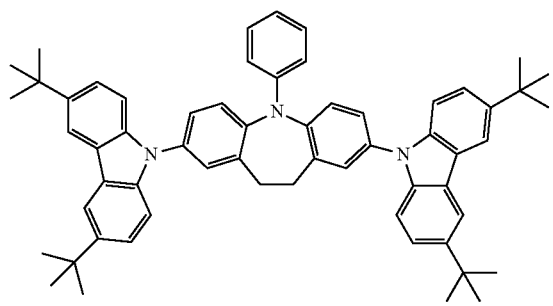
Compound 11
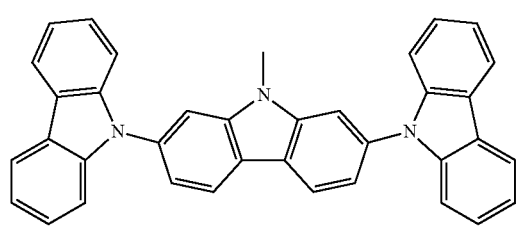

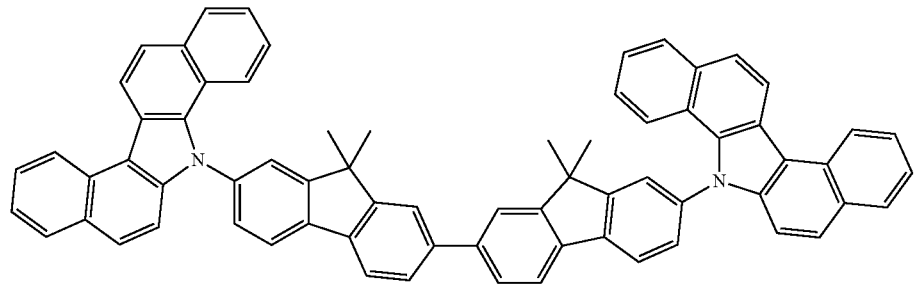

Compound 12

For the purpose of knowing the change in surface potential of the electron blocking layer(s) and the photoelectric conversion layer in each of the imaging devices obtained in Examples 1 through 16 and Comparative Examples 1 through 8 by a Kelvin probe method, elements dedicated for the measurement were made as follows.

Making Element for the Measurement of Surface Potential Change of Electron Blocking Layer (A) of Example 1:

A silicon substrate having formed thereon a pixel electrode of the same composition as in Example 1 was prepared. A 100 nm thick electron blocking layer (A) was deposited on the silicon substrate by vacuum evaporation of compound 1 at a degree of vacuum of $5.0 \times 10^{-4}$ Pa or less and a rate of 0.1 to 1 nm/sec to make an element for the measurement, designated element JS1. While being kept away from contact with the air, element JS1 was transferred to a glove box in which the moisture and the oxygen concentration were 1 ppm or less. In the glove box the surface potential of the electron blocking layer (A) was measured by the Kelvin probe method. The change of from the surface potential of the first surface (lower surface facing the pixel electrode) to that of the second surface (upper surface) of the electron blocking layer (A) was −0.2 eV. The surface potential change of the electron blocking layer (A) of each of the imaging devices of Examples 9 to 13 and Comparative Examples 6 to 8 was identical to the value measured with the element JS1.

Making Element for the Measurement of Surface Potential Change of Electron Blocking Layer (A) of Examples 2 to 8 and Comparative Examples 1 to 5:

Elements for the measurement were made in the same manner as for element JS1, except for changing the material and/or the thickness of the electron blocking layer (A) as shown in Tables 1 and 2. The change of from the surface potential of the first surface to that of the second surface of the electron blocking layer (A) was measured using each of the resulting elements. The results obtained are shown in Tables 1 and 2.

The surface potential change of the electron blocking layer (A) in the imaging devices of Examples 14 to 16 was identical to that of Example 3.

Making Element for the Measurement of Surface Potential Change of Electron Blocking Layer (B) of Example 9:

A silicon substrate having formed thereon a pixel electrode of the same composition as in Example 9 was prepared. An electron blocking layer (A) was formed on the silicon substrate in the same manner as in Example 9. An electron blocking layer (B) was then formed thereon in the same manner as in Example 9 to make an element for the measurement, designated element JS9. The vacuum evaporation of the organic compounds was carried out at a degree of vacuum of $5.0 \times 10^{-4}$ Pa or less and a rate of 0.1 to 1 nm/sec. While being kept away from contact with the air, element JS9 was transferred to a glove box in which the moisture and the oxygen concentration were 1 ppm or less. In the glove box the surface potential of the electron blocking layer (B) of element JS9 was measured by the Kelvin probe method. The change of from the surface potential of the first surface (lower surface nearer to the pixel electrode) to that of the second surface (upper surface) of the electron blocking layer (B) was −0.42 eV.

Making Element for the Measurement of Surface Potential Change of Electron Blocking Layer (B) of Examples 10 to 13 and Comparative Examples 6 to 8:

Elements for the measurement were made in the same manner as for element JS9, except for changing the material and/or the thickness of the electron blocking layer (B) as shown in Tables 1 and 2. The change of from the surface potential of the first surface to that of the second surface of the electron blocking layer (B) was measured using each of the resulting elements. The results obtained are shown in Tables 1 and 2.

Making Element for the Measurement of Surface Potential Change of Electron Blocking Layer (B) of Example 14:

A silicon substrate having formed thereon a pixel electrode of the same composition as in Example 14 was prepared. An electron blocking layer (A) was formed on the silicon substrate in the same manner as in Example 14. An electron blocking layer (B) was then formed thereon in the same manner as in Example 14 to make an element for the measurement, designated element JS14. The vacuum evaporation of the organic compounds was carried out at a degree of vacuum of $5.0 \times 10^{-4}$ Pa or less and a rate of 0.1 to 1 nm/sec. While being kept away from contact with the air, element JS14 was transferred to a glove box in which the moisture and the oxygen concentration were 1 ppm or less. In the glove box the surface potential of the electron blocking layer (B) of element JS14 was measured by the Kelvin probe method. The change of from the surface potential of the first surface (lower surface facing the pixel electrode) to that of the second surface (upper surface) of the electron blocking layer (B) was −0.64 eV.

Making Element for the Measurement of Surface Potential Change of Electron Blocking Layer (B) of Examples 15 and 16:

Elements for the measurement were made in the same manner as for element JS14, except for changing the material and/or the thickness of the electron blocking layer (B) as shown in Tables 1-1 to 1-4. The change of from the surface potential of the first surface to that of the second surface of the electron blocking layer (B) was measured using each of the resulting elements. The results obtained are shown in Tables 1-1 to 1-4.

White light was allowed to impinge on the counter electrode of each of the imaging devices fabricated in Examples 1 through 16 and Comparative Examples 1 through 8 with an electric field of $1.0\times10^5$ V/cm or $2.0\times10^5$ V/cm applied to the counter electrode, and the signal output was measured. The signal output was expressed relative to that of Example 1 taken as 1 for each electric field intensity. Furthermore, a resolution chart was taken by each imaging device under the same conditions as above, and the test picture obtained was evaluated for freedom from pixel crosstalk.

The results of the measurement and evaluation were shown in Tables 1 and 2. Although the surface potential changes of the electron blocking layers shown in Tables 1 and 2 were not the values as actually determined using the imaging devices but those obtained using simplified elements dedicated for testing, they were regarded to be identical to the values actually determined on the imaging devices because the elements were prepared under the same conditions as for the imaging devices. Separately, an element for measuring the change in surface potential of the photoelectric conversion layer was made in the same manner as for element JS1, except for forming the photoelectric conversion layer under the same condition as in Example 1 instead of the electron blocking layer. As a result of measurement, the change in surface potential from the first surface to the second surface of the photoelectric conversion layer was −0.5 to 0.5 eV.

TABLE 1

| | Electron Blocking Layer (A) | | | Electron Blocking Layer (B) | | |
|---|---|---|---|---|---|---|
| Example No. | Material | Thickness (nm) | Surface Potential Change (eV) | Material | Thickness (nm) | Surface Potential Change (eV) |
| 1 | compound 1 | 100 | −0.2 | | | |
| 2 | compound 6 | 100 | 2.6 | | | |
| 3 | compound 7 | 100 | 0.8 | | | |
| 4 | compound 9 | 100 | 0.44 | | | |
| 5 | compound 9 | 200 | 0.88 | | | |
| 6 | compound 10 | 100 | 2.8 | | | |
| 7 | compound 11 | 50 | 0.65 | | | |
| 8 | compound 12 | 100 | −0.6 | | | |
| 9 | compound 1 | 100 | −0.2 | compound 3 | 3 | −0.42 |
| 10 | compound 1 | 100 | −0.2 | compound 4 | 3 | −0.43 |
| 11 | compound 1 | 100 | −0.2 | compound 5 | 3 | 0.15 |
| 12 | compound 1 | 100 | −0.2 | compound 5 | 50 | 2.5 |
| 13 | compound 1 | 100 | −0.2 | compound 3 | 6 | −0.64 |
| 14 | compound 7 | 100 | 0.8 | compound 3 | 6 | −0.64 |
| 15 | compound 7 | 100 | 0.8 | compound 4 | 6 | −0.64 |
| 16 | compound 7 | 100 | 0.8 | compound 8 | 20 | 0.62 |

| | 1.0E+5 V/cm | | 2.0E+5 V/cm | |
|---|---|---|---|---|
| Example No. | Relative Signal Output | Pixel crosstalk | Relative Signal Output | Pixel Cross Talk |
| 1 | 1 | no | 1 | no |
| 2 | 0.8 | no | 1 | no |
| 3 | 1 | no | 1 | no |
| 4 | 1 | no | 1 | no |
| 5 | 1 | no | 1 | no |
| 6 | 0.8 | no | 1 | no |
| 7 | 1 | no | 1 | no |
| 8 | 1 | almost no | 1 | no |
| 9 | 1 | no | 1 | no |
| 10 | 1 | no | 1 | no |
| 11 | 1 | no | 1 | no |
| 12 | 0.8 | no | 1 | no |
| 13 | 1 | almost no | 1 | no |
| 14 | 1 | almost no | 1 | no |
| 15 | 1 | almost no | 1 | no |
| 16 | 1 | no | 1 | no |

| | Electron Blocking Layer (A) | | | Electron Blocking Layer (B) | | |
|---|---|---|---|---|---|---|
| Compara. Example No. | Material | Thickness (nm) | Surface Potential Change (eV) | Material | Thickness (nm) | Surface Potential Change (eV) |
| 1 | compound 3 | 100 | −1.05 | | | |
| 2 | compound 4 | 100 | −1.04 | | | |
| 3 | compound 5 | 100 | 5 | | | |
| 4 | compound 6 | 200 | 5.2 | | | |
| 5 | compound 8 | 150 | 4.5 | | | |
| 6 | compound 1 | 100 | −0.2 | compound 3 | 10 | −1.05 |
| 7 | compound 1 | 100 | −0.2 | compound 4 | 10 | −1.04 |
| 8 | compound 1 | 100 | −0.2 | compound 5 | 70 | 3.5 |

TABLE 1-continued

| Compara. Example No. | 1.0E+5 V/cm | | 2.0E+5 V/cm | |
|---|---|---|---|---|
| | Relative Signal Output | Pixel crosstalk | Relative Signal Output | Pixel Cross Talk |
| 1 | 1 | yes | 1 | yes |
| 2 | 1 | yes | 1 | yes |
| 3 | 0.6 | no | 0.8 | no |
| 4 | 0.6 | no | 0.8 | no |
| 5 | 0.6 | no | 0.8 | no |
| 6 | 1 | yes | 1 | yes |
| 7 | 1 | yes | 1 | yes |
| 8 | 0.7 | no | 0.9 | no |

As shown in Tables 1 and 2, with the applied electric field of $2.0 \times 10^5$ V/cm, the imaging devices of Examples 1 to 16 prevent the pixel crosstalk phenomenon whereas pixel crosstalk occurs with the imaging devices of Comparative Examples 1, 2, 6, and 7. With the weaker electric field of $1.0 \times 10^5$ V/cm, while the imaging devices of Examples 8, 13, 14, and 15 have slightly reduced resolution, the degree of pixel crosstalk was acceptable for practical use. It was seen from these results that pixel crosstalk was avoided successively even with a very small distance, as small as 200 nm, between adjacent pixel electrodes when every electron blocking layer has a surface potential change of −1 eV or greater, preferably −0.5 eV or greater. Reducing the distance between adjacent pixel electrodes allows for providing an imaging device having an increased number of pixels and a reduced size.

In Comparative Examples 3 to 5 and 8, sensitivity under an electric field of $2.0 \times 10^5$ V/cm reduced. In Examples 2, 6, and 12, sensitivity under a weaker electric field of $1.0 \times 10^5$ V/cm reduced. These results indicate that reduction in sensitivity was suppressed when every electron blocking layer of an imaging device has a surface potential change of 3 eV or less, preferably 1 eV or less.

Examples 17 and 18 and Comparative Examples 9 and 10

In order to evaluate the influences of the distance between adjacent pixel electrodes on the imaging device performance, imaging devices were fabricated in the same manner as in Example 3, except for changing the size of a side of the pixel electrode and the distance between adjacent pixel electrodes as shown in Table 2.

The counter electrode of each of the imaging devices fabricated in Examples 3, 17 and 18 and Comparative Examples 9 and 10 was irradiated with white light with an electric field of $2.0 \times 10^5$ V/cm applied to the counter electrode, and the signal output was measured. The signal output was expressed relative to that of Example 3 as 1. A resolution chart was photographed with each imaging device under the same conditions as above, and the resulting test picture was inspected for pixel crosstalk. The results of evaluation were shown in Table 2. All the imaging devices tested have a pixel size of 2 μm and one electron blocking layer (A) of which the surface potential change was within the range specified in the invention.

TABLE 2

| | Distance between Adjacent Pixel Electrodes (nm) | Side Size of Pixel Electrode (μm) | Pixel Cross Talk | Relative Signal Output |
|---|---|---|---|---|
| Example 3 | 200 | 1.80 | no | 1 |
| Example 17 | 250 | 1.75 | no | 1 |
| Example 18 | 150 | 1.85 | no | 1 |
| Comparative Example 9 | 300 | 1.70 | no | 0.9 |
| Comparative Example 10 | 500 | 1.50 | no | 0.7 |

Comparison of Examples 3, 17, and 18 in which the distance between adjacent pixels is 250 nm or smaller reveals that the relative signal output was equal irrespective of the pixel electrode size. In Comparative Examples 9 and 10 in which the distance between adjacent pixel electrodes exceeds 250 nm, in contrast, the signal output reduced with a reduction in pixel electrode size. Pixel crosstalk did not occur in any of Examples 3, 17, and 18 and Comparative Examples 9 and 10.

The same test was carried out on imaging devices fabricated in the same manner as in Examples 1, 2, and 4 to 8, except for changing the distance between adjacent pixel electrodes. The data obtained demonstrate the same trend as shown in Table 2.

It was seen from these results that, if the distance between adjacent pixel electrodes exceeds 250 nm, it was impossible to obtain both high sensitivity and high quality image free from pixel crosstalk even by limiting the surface potential change in accordance with the invention. In other words, both high sensitivity and freedom from the pixel crosstalk problem would be able to achieve by limiting the surface potential change of every electron blocking layer to the range of from −1 eV (preferably −0.5 eV) to 3 eV (preferably 1 eV) and limiting the distance between adjacent pixel electrodes to 250 nm or less.

Examples 19 and 20 and Comparative Examples 11 and 12

Imaging devices were fabricated in the same manner as in Example 3, except for increasing the pixel size to 2.2 μm and changing the side size of the pixel electrode and the distance between adjacent pixel electrodes as shown in Table 3.

The counter electrode of each of the imaging devices fabricated in Examples 19 and 20 and Comparative Examples 11 and 12 was irradiated with white light with an electric field of $2.0 \times 10^5$ V/cm applied to the counter electrode, and the signal output was measured. The signal output was expressed relative to that of Example 19 as 1. A resolution chart was photographed with each imaging device under the same conditions as above, and the resulting test picture was inspected for pixel crosstalk. The results obtained are shown in Table 3. All the imaging devices tested had a pixel size of 2.2 μm and one electron blocking layer (A) of which the surface potential change was within the range specified in the invention.

TABLE 3

| | Distance between Adjacent Pixel Electrodes (nm) | Side Size of Pixel Electrode (μm) | Pixel crosstalk | Relative Signal Output |
|---|---|---|---|---|
| Example 19 | 250 | 1.95 | no | 1 |
| Example 20 | 150 | 2.05 | no | 1 |
| Comparative Example 11 | 300 | 1.90 | no | 0.92 |
| Comparative Example 12 | 500 | 1.70 | no | 0.75 |

Comparison of Examples 19 and 20 in which the distance between adjacent pixels was 250 nm or smaller proved that the relative signal output was equal irrespective of the pixel electrode size. In Comparative Examples 11 and 12 in which the distance between adjacent pixel electrodes exceeded 250 nm, in contrast, the signal output reduced with a reduction in pixel electrode size. Pixel crosstalk did not occur in any of Examples 19 and 20 and Comparative Examples 11 and 12.

The same test was carried out on imaging devices fabricated in the same manner as in Examples 1, 2, and 4 to 8, except for changing the distance between adjacent pixel electrodes. The data obtained demonstrate the same trend as shown in Table 3.

It is thus seen that both high sensitivity and high image quality free from pixel crosstalk are achievable when the surface potential change of every electron blocking layer is in the range of from −1 eV (preferably −0.5 eV) to 3 eV (preferably 1 eV) and the distance between adjacent pixel electrodes is 250 nm or less.

Examples 21 and 22 and Comparative Examples 13 and 14

Imaging devices were fabricated in the same manner as in Example 9, except for changing the side size of the pixel electrode and the distance between adjacent pixel electrodes as shown in Table 4.

The counter electrode of each of the imaging devices of Examples 9, 21, and 22 and Comparative Examples 13 and 14 was irradiated with white light with an electric field of 2.0×10$^5$ V/cm applied to the counter electrode, and the signal output is measured. The signal output was expressed relative to that of Example 9 as 1. A resolution chart was photographed with each of the devices under the same conditions as above, and the resulting test picture is inspected for pixel crosstalk. The results were shown in Table 4. All the imaging devices tested have a pixel size of 2 μm and two electron blocking layers (A and B), the surface potential change of each of which was within the range specified in the invention.

TABLE 4

| | Distance between Adjacent Pixel Electrodes (nm) | Side Size of Pixel Electrode (μm) | Pixel crosstalk | Relative Signal Output |
|---|---|---|---|---|
| Example 9 | 200 | 1.80 | no | 1 |
| Example 21 | 250 | 1.75 | no | 1 |
| Example 22 | 150 | 1.85 | no | 1 |
| Comparative Example 13 | 300 | 1.70 | no | 0.9 |
| Comparative Example 14 | 500 | 1.50 | no | 0.7 |

As shown in Table 4, the imaging devices having two electron blocking layers also demonstrate the same trend as shown in Table 2. It was thus proved that both high sensitivity and freedom from the pixel crosstalk problem can be achieved irrespective of the number of the electron blocking layers as far as the surface potential change of every electron blocking layer was in the range of from −1 eV (preferably −0.5 eV) to 3 eV (preferably 1 eV) and the distance between adjacent pixel electrodes was 250 nm or less.

Comparative Examples 15 to 18

Imaging devices were fabricated in the same manner as in Comparative Example 1, except for changing the side size of the pixel electrode and the distance between adjacent pixel electrodes as shown in Table 5.

The counter electrode of each of the imaging devices fabricated in Comparative Examples 1 and 15 to 18 was irradiated with white light with an electric field of 2.0×10$^5$ V/cm applied to the counter electrode, and the signal output was measured. The signal output was expressed relative to that of Comparative Example 1 as 1. A resolution chart was photographed with each device under the same conditions as above, and the resulting test picture was inspected for pixel crosstalk. The results obtained are shown in Table 5. All the imaging devices tested have a pixel size of 2 μm and one electron blocking layer of which the surface potential change was out of the range specified in the invention.

TABLE 5

| | Distance between Adjacent Pixel Electrodes (nm) | Side Size of Pixel Electrode (μm) | Pixel crosstalk | Relative Signal Output |
|---|---|---|---|---|
| Comparative Example 1 | 200 | 1.80 | yes | 1 |
| Comparative Example 15 | 100 | 1.90 | yes | 1 |
| Comparative Example 16 | 250 | 1.75 | yes | 1 |
| Comparative Example 17 | 300 | 1.70 | yes | 0.9 |
| Comparative Example 18 | 500 | 1.50 | no | 0.7 |

As demonstrated in Table 5, none of the comparative imaging devices tested achieved both high sensitivity (a relative signal output of 1) and freedom from the pixel crosstalk problem. It is thus evident that merely limiting the distance between adjacent pixel electrodes to 250 nm or less is not sufficient to obtain both high sensitivity and high image quality from pixel crosstalk.

Comparative Examples 19 to 22

Imaging devices were fabricated in the same manner as in Comparative Example 6, except for changing the side size of the pixel electrode and the distance between adjacent pixel electrodes as shown in Table 6.

The counter electrode of each of the imaging devices fabricated in Comparative Examples 6 and 19 to 22 was irradiated with white light with an electric field of $2.0 \times 10^5$ V/cm applied to the counter electrode, and the signal output was measured. The signal output was expressed relative to that of Comparative Example 6 as 1. A resolution chart was photographed with each imaging device under the same conditions as above, and the resulting test picture was inspected for pixel crosstalk. The results obtained are shown in Table 6. All the imaging devices tested had a pixel size of 2 μm and two electron blocking layers of each of which the surface potential change is out of the range specified in the invention.

TABLE 6

| | Distance between Adjacent Pixel Electrodes (nm) | Side Size of Pixel Electrode (μm) | Pixel crosstalk | Relative Signal Output |
|---|---|---|---|---|
| Comparative Example 6 | 200 | 1.80 | yes | 1 |
| Comparative Example 19 | 100 | 1.90 | yes | 1 |
| Comparative Example 20 | 250 | 1.75 | yes | 1 |
| Comparative Example 21 | 300 | 1.70 | yes | 0.9 |
| Comparative Example 22 | 500 | 1.50 | no | 0.7 |

As shown in Table 6, none of the comparative imaging devices tested achieved both high sensitivity (a relative signal output of 1) and freedom from the pixel crosstalk problem. It is thus understood that irrespective of whether there is one or more than one electron blocking layer, merely limiting the distance between adjacent pixel electrodes to 250 nm or less is not sufficient to obtain both high sensitivity and high image quality.

As described, the invention discloses the following.

The invention discloses in a first aspect an imaging device including a substrate, an array of photoelectric conversion elements above the substrate, and read-out portions one each for each photoelectric conversion element. The photoelectric conversion elements each includes a photoelectric conversion layer generating charge in response to light incident thereon, a first electrode collecting the charge, a second electrode opposite to the first electrode, and at least one electron blocking layer. The photoelectric conversion layer is between the first electrode and the second electrode. The at least one electron blocking layer is between the first electrode and the photoelectric conversion layer. The read-out portions read a signal corresponding to the charge generated by the respective photoelectric conversion elements. The distance between the first electrodes of adjacent photoelectric conversion elements is 250 nm or smaller. Each of the electron blocking layers has a first surface nearer to the first electrode and a second surface nearer to the second electrode. Each of the electron blocking layer has a change in surface potential of −1 to 3 eV from the first surface to the second surface.

The disclosed imaging device embraces an embodiment in which each of the electron blocking layers has a change in surface potential of −0.5 eV or more from the first surface to the second surface.

The disclosed imaging device embraces another embodiment in which each of the electron blocking layers has a change in surface potential of 1 eV or less from the first surface to the second surface.

The disclosed imaging device embraces still another embodiment in which the photoelectric conversion layer has a bulk heterojunction structure formed of a mixture of a p type organic semiconductor and a fullerene or a fullerene derivative.

The invention discloses in a second aspect a method for fabricating the imaging device of the invention. The method includes the step of forming the array of photoelectric conversion elements above the substrate. The step includes the substep of deciding the thickness and the material of every electron blocking layer so that the electron blocking layer has a change in surface potential of −1 to 3 eV from the first surface to the second surface and the substep of forming the first electrode for every photoelectric conversion element so that the distance between the first electrodes of adjacent photoelectric conversion elements is 250 nm or smaller.

The disclosed method embraces an embodiment in which the thickness and the material of every electron blocking layer are decided so that the electron blocking layer has a change in surface potential of −5 eV or more from the first surface to the second surface.

The disclosed method embraces another embodiment in which the thickness and the material of every electron blocking layer are decided so that the electron blocking layer has a change in surface potential of 1 eV or less from the first surface to the second surface.

The disclosed method embraces still another embodiment in which the step of forming the array of photoelectric conversion elements above the substrate further includes the substep of forming the photoelectric conversion layer by co-depositing a p type organic semiconductor and a fullerene or a fullerene derivative.

The invention discloses in a third aspect an imaging apparatus including the imaging device of the invention.

The present application is based on Japanese Patent Application Nos. 2010-041127, filed on Feb. 25, 2010 and 2010-204944, filed Sep. 13, 2010, the entire contents of which are incorporated herein by reference.

INDUSTRIAL APPLICABILITY

The present invention provides an imaging device having a configuration that achieves high sensitivity, prevents pixel crosstalk, and allows for increasing the number of pixels and device miniaturization; a method for making the imaging device; and an imaging apparatus having the imaging device. The imaging device is possible to be mounted on an imaging apparatus, such as a digital still camera or a digital video camera, or an imaging module of a mobile phone, an endoscope, and the like.

DESCRIPTION OF THE NUMERICAL REFERENCES OF THE DRAWINGS 100 pixel
6 pixel electrode
7 electron blocking layer
9 photoelectric conversion layer
10 counter electrode

The invention claimed is:
1. An imaging device comprising:
    a plurality of photoelectric conversion elements that is arranged above a substrate; and
    a read-out portion that reads out signal corresponding to charges which are generated from each of the photoelectric conversion elements, wherein each of the photoelectric conversion elements comprises:
a first electrode that collects the charge;
a second electrode that is disposed opposite to the first electrode;
a photoelectric conversion layer that generates the charges in response to light incident on the photoelectric conversion layer and disposed between the first electrode and the second electrode; and
an electron blocking layer that is disposed between the first electrode and the photoelectric conversion layer,
wherein a distance between the first electrodes of adjacent photoelectric conversion elements is 250 nm or smaller, and
each of the electron blocking layers has a first face nearer to the first electrode and a second face nearer to the second electrode and has a change in surface potential of −1 to 3 eV from the first face to the second face.

2. The imaging device according to claim 1, wherein each of the electron blocking layer has a change in surface potential of −0.5 eV or more from the first face to the second face.

3. The imaging device according to claim 1, wherein each of the electron blocking layer has a change in surface potential of 1 eV or less from the first face to the second face.

4. The imaging device according to claim 2, wherein each of the electron blocking layer has a change in surface potential of 1 eV or less from the first face to the second face.

5. The imaging device according to claim 1, wherein the photoelectric conversion layer has a bulk heterojunction structure formed of a mixture of a p type organic semiconductor and a fullerene or a fullerene derivative.

6. The imaging device according to claim 2, wherein the photoelectric conversion layer has a bulk heterojunction structure formed of a mixture of a p type organic semiconductor and a fullerene or a fullerene derivative.

7. The imaging device according to claim 3, wherein the photoelectric conversion layer has a bulk heterojunction structure formed of a mixture of a p type organic semiconductor and a fullerene or a fullerene derivative.

8. The imaging device according to claim 4, wherein the photoelectric conversion layer has a bulk heterojunction structure formed of a mixture of a p type organic semiconductor and a fullerene or a fullerene derivative.

9. A method for fabricating an imaging device including a substrate, an array of photoelectric conversion elements above the substrate, and read-out portions one each for each photoelectric conversion element, the photoelectric conversion elements each comprising a photoelectric conversion layer generating charge in response to light incident thereon, a first electrode collecting the charge, a second electrode opposite to the first electrode, and at least one electron blocking layer, the photoelectric conversion layer being between the first electrode and the second electrode, the at least one electron blocking layer being between the first electrode and the photoelectric conversion layer and having a first face nearer to the first electrode and a second face nearer to the second electrode, and the read-out portions being to read a signal corresponding to the charge generated by the respective photoelectric conversion elements, the method comprising forming the array of photoelectric conversion elements above the substrate,
wherein the forming step includes:
deciding the thickness and the material of the at least one electron blocking layer so that each of the at least one electron blocking layer has a change in surface potential of −1 to 3 eV from the first face to the second face; and
forming the first electrode for every one of the photoelectric conversion elements so that the distance between the first electrodes of adjacent photoelectric conversion elements is 250 nm or smaller.

10. The method according to claim 9, wherein the thickness and the material of each of the at least one electron blocking layer are decided so that each of the at least one electron blocking layer has a change in surface potential of −0.5 eV or more from the first face to the second face.

11. The method according to claim 9, wherein the thickness and the material of each of the at least one electron blocking layer are decided so that each of the at least one electron blocking layer has a change in surface potential of 1 eV or less from the first face to the second face.

12. The method according to claim 10, wherein the thickness and the material of each of the at least one electron blocking layer are decided so that each of the at least one electron blocking layer has a change in surface potential of 1 eV or less from the first face to the second face.

13. The method according to any one of claim 9, wherein the forming step further includes forming the photoelectric conversion layer by co-depositing a p type organic semiconductor and a fullerene or a fullerene derivative.

14. The method according to any one of claim 10, wherein the forming step further includes forming the photoelectric conversion layer by co-depositing a p type organic semiconductor and a fullerene or a fullerene derivative.

15. The method according to any one of claim 11, wherein the forming step further includes forming the photoelectric conversion layer by co-depositing a p type organic semiconductor and a fullerene or a fullerene derivative.

16. The method according to any one of claim 12, wherein the forming step further includes forming the photoelectric conversion layer by co-depositing a p type organic semiconductor and a fullerene or a fullerene derivative.

17. An imaging apparatus comprising the imaging device according to claim 1.

* * * * *